(12) United States Patent
Roy et al.

(10) Patent No.: US 12,366,800 B2
(45) Date of Patent: Jul. 22, 2025

(54) METHOD FOR IMPROVING ACCURACY OF IMPRINT FORCE APPLICATION IN IMPRINT LITHOGRAPHY

(71) Applicant: CANON KABUSHIKI KAISHA, Tokyo (JP)

(72) Inventors: Nilabh K. Roy, Austin, TX (US); Mario Johannes Meissl, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 741 days.

(21) Appl. No.: 17/525,511

(22) Filed: Nov. 12, 2021

(65) Prior Publication Data

US 2023/0152687 A1   May 18, 2023

(51) Int. Cl.
*G03F 7/00* (2006.01)

(52) U.S. Cl.
CPC .................. *G03F 7/0002* (2013.01)

(58) Field of Classification Search
CPC ................................... G03F 7/0002
See application file for complete search history.

(56) References Cited

U.S. PATENT DOCUMENTS

| 8,140,288 B2 | 3/2012 | Yang |
| 8,945,444 B2 | 2/2015 | Lu |

(Continued)

FOREIGN PATENT DOCUMENTS

JP   2017072219 A  *  4/2017  ........... G03F 7/0002

OTHER PUBLICATIONS

Nilabh Roy, Mario Meissl, Takahiro Yoshida, Anshuman Cherala, Xiaoming Lu, Jeffrey Klein, Mingji Lou, Jin Choi, Hiroyuki Sekiguchi, Takashi Shibayama, Mitsuru Hiura, "Overlay models for nanoimprint lithography," (Mar. 1, 2021) (Year: 2021).*

(Continued)

*Primary Examiner* — Larry W Thrower
*Assistant Examiner* — John W Hatch
(74) *Attorney, Agent, or Firm* — CANON U.S.A., INC. IP DIVISION (57) ABSTRACT

A method for correcting a final imprint force FIF in an imprint process is provided. Position traces of an imprint head exercising along a predetermined trajectory are obtained. A force disturbance model is established based on prior position and force traces of the imprint head. A disturbance force $F_{mod,FIF,i}$ is using a predetermined motion sequence based on the force disturbance model for wafer i, where i=1 to n. A residual force offset (RFO) measurement is performed to determine an actual force $F_{act,RFO,i}$ applied to wafer i. A disturbance force $F_{mod,FIF,i,j}$ applied to a field j of the wafer i is calculated using the force disturbance model, where j=1 to m. An adjustment is applied to the RFO measurement. An imprint force is applied to a film on the wafer i with the imprint head based on an output of the adjustment applied to $F_{act,RFO,i}$ and a desired force to be applied to the film on the wafer.

6 Claims, 5 Drawing Sheets

(56) References Cited

U.S. PATENT DOCUMENTS

| | | |
|---|---|---|
| 9,090,014 B2 | 7/2015 | Lu |
| 10,241,424 B2 | 3/2019 | Asano |
| 10,534,259 B2 | 1/2020 | Choi |
| 2021/0299921 A1 | 9/2021 | Roy |

OTHER PUBLICATIONS

JP-2017072219-A english translation (Year: 2017).*

* cited by examiner

METHOD FOR IMPROVING ACCURACY OF IMPRINT FORCE APPLICATION IN IMPRINT LITHOGRAPHY

BACKGROUND

Field of Art

The present disclosure relates to nanoimprint lithography, and more particularly, to a method for improving accuracy of final imprint force application in nanoimprint lithography.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate; therefore, nano-fabrication becomes increasingly important. Nano-fabrication provides for greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating one or more layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into and/or onto an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, formable material removal, dicing, bonding, packaging, and the like.

SUMMARY

A method for correcting a final imprint force FIF in an imprint process is provided. Position traces of an imprint head exercising along a predetermined trajectory are obtained. A force disturbance model is established based on prior position and force traces of the imprint head. A disturbance force $F_{mod,FIF,i,j}$ that will be applied to a field j of the wafer i is predicted using a predetermined motion sequence based on the force disturbance model, where i=1 to n, where j=1 to m. A residual force offset (RFO) measurement is performed to determine an actual disturbance force $F_{act,RFO,i}$ measured prior to imprinting wafer i. An adjustment is applied to the RFO measurement. An imprint force is applied to a film on the wafer i with the imprint head based on an output of the adjustment applied to $F_{act,RFO,i}$ and a desired force to be applied to the film on the wafer.

The method further comprises applying the adjustment to the RFO measuring by scaling the actual force $F_{act,RFO,i}$ with a scaling factor SF calculated based on a modeled disturbance force $F_{mod,RFO,i}$ of the wafer i and an average of $F_{mod,FIF}$ i,j over m fields of the wafer i. The scaling factor SF may be calculated by minimizing a weighting function $W_i$ as:

$$W_i = SF \cdot F_{Mod,RFO,i} + \frac{1}{m}\sum_{j=1}^{m} F_{Mod,FIF,i,j}$$

$$\min_{SF} \sum_{i=1}^{n}\left(W_i - \frac{1}{n}\sum_{i=1}^{n} W_i\right)^2$$

where the scaling factor is calculated for each wafer i and field j of the wafer i.

In another embodiment, the adjustment is applied by calculating a difference $\Delta F_{mod,i,j}$ between $F_{mod,RFO,i}$ and $F_{mod,FIF,i,j}$ and adding the difference $\Delta F_{mod,i,j}$ to the $F_{act,RFO,i}$ The difference of force disturbance $\Delta F_{mod,i}$ is added to the $F_{act,RFO}$ for each individual field j of the wafer i. An average of the difference of force disturbance $\Delta F_{mod,i,j}$ for n wafers may be added to $F_{act,RFO,i}$ as:

$$FIF \text{ Offset}_i = F_{act,RFO,i} + \frac{1}{m}\sum_{j} \Delta F_{mod,i,j}.$$

A method of manufacturing an article is provided. The method comprises applying a formable material on a substrate, and moving an imprint head to be in contact with the formable material with a corrected final imprint force FIF. The FIF is corrected by the following steps. Position traces of an imprint head exercising along a predetermined trajectory are obtained. A force disturbance model is established based on prior position and force traces of the imprint head. A disturbance force $F_{mod,FIF,i,j}$ that will be applied to a field j of the wafer i is predicted using a predetermined motion sequence based on the force disturbance model, where i=1 to n, where j=1 to m. A residual force offset (RFO) measurement is performed to determine an actual force disturbance $F_{act,RFO,i}$ measured prior to imprinting wafer i. An adjustment is applied to the RFO measurement. An imprint force is applied to a film on the wafer i with the imprint head based on an output of the adjustment applied to $F_{act,RFO,i}$ and a desired force to be applied to the film on the wafer.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Nanoimprint System

Figure 1:
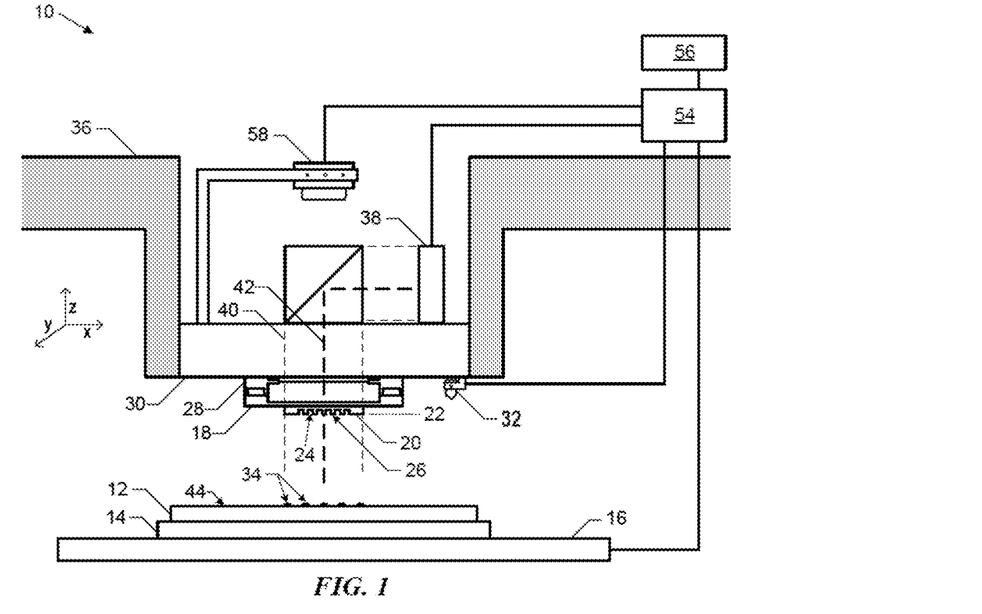
FIG. 1 is a diagram illustrating an apparatus.

FIG. 1 illustrates a nanoimprint lithography apparatus 10 in which an embodiment may be implemented. Apparatus 10 may be used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like.

Substrate 12 and substrate chuck 14 may be further supported by positioning stage 16. Stage 16 may provide translational and/or rotational motion along one or more of the x, y, z, θ, and φ axes. Stage 16, substrate 12, and substrate chuck 14 may also be positioned on a base (not shown).

Spaced-apart from substrate 12 is template 18. Template 18 may include a body having a first side and a second side with one side having a mesa 20 (also referred to as mold 20) extending therefrom towards substrate 12. Mesa 20 may have a patterning surface 22 thereon. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12. Alternatively, template surface 22 may be blank, i.e. without pattern features, in which case a planar surface can be formed on the substrate. In an alternative embodiment, when the patterning surface 22 is of the same areal size as the substrate, a layer can be formed over the entire substrate (e.g., whole substrate processing).

Template 18 may be coupled to template chuck 28. Template chuck 28 may be configured as, but not limited to, vacuum, pin-type, groove-type, electrostatic, electromagnetic, and/or other similar chuck types. Further, template chuck 28 may be coupled to the imprint head 30 which in turn may be moveably coupled to bridge 36 such that template chuck 28, head 30 and template 18 are moveable in at least the z-axis direction.

Apparatus 10 may further comprise a fluid dispense system 32. Fluid dispense system 32 may be used to deposit formable material 34 (e.g., polymerizable material) on substrate 12. Formable material 34 may be positioned upon substrate 12 using techniques such as drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations.

Fluid dispense system 32 may use different technologies to dispense formable material 34. When the formable material 34 is capable of jetting, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

Apparatus 10 may further comprise radiation source 38 that directs actinic energy 40 along path 42. Imprint head 30 and stage 16 may be configured to position template 18 and substrate 12 in superimposition with path 42. Camera 58 may likewise be positioned in superimposition with path 42. Apparatus 10 may be regulated by processor 54 in communication with stage 16, head 30, fluid dispense system 32, source 38, and/or camera 58 and may operate on a computer readable program stored in memory 56.

Either head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces actinic energy 40 (e.g., ultraviolet radiation) curing the formable material 34, that is, causing formable material 34 to solidify and/or cross-link conforming to a shape of substrate surface 44 of substrate 12 and patterning surface 22 of template 18, defining a formed layer on substrate 12. In an embodiment, the substrate 12, may be a substrate, an unpatterned template, or some other object on which the formable material 34 is shaped by the template 18.

Final Imprint Force (FIF) Setpoint Correction

Final imprint force (FIF) is defined as the force exerted by the mask or template on the formable material 34 on the substrate 12 at the end of the imprint process, that is, at the end of curing the formable material 34 with actinic energy 40. In an alternative embodiment, the FIF is an imprint force at a time instance t after the imprint head 30 starts to move towards the substrate 12 during each imprint period. An imprint period is the period of time that starts with moving imprint head 30 toward the substrate and ends with moving the imprint head 30 away from the substrate after the formable material 34 is cured by the actinic energy 40. This is a critical parameter that needs to be controlled with high precision in imprint lithography to achieve target overlay specifications. FIF measurement is difficult for feedback control as most force sensors with enough sensitivity have significant compliance, and any such sensor in the force path may affect the alignment and imprint process significantly, including overlay distortions. It is also very difficult to find sensors that satisfy a large measurement range, a high resolution at high bandwidths, and/or overload protection for unexpected high force events, for example, during separation.

Figure 2:
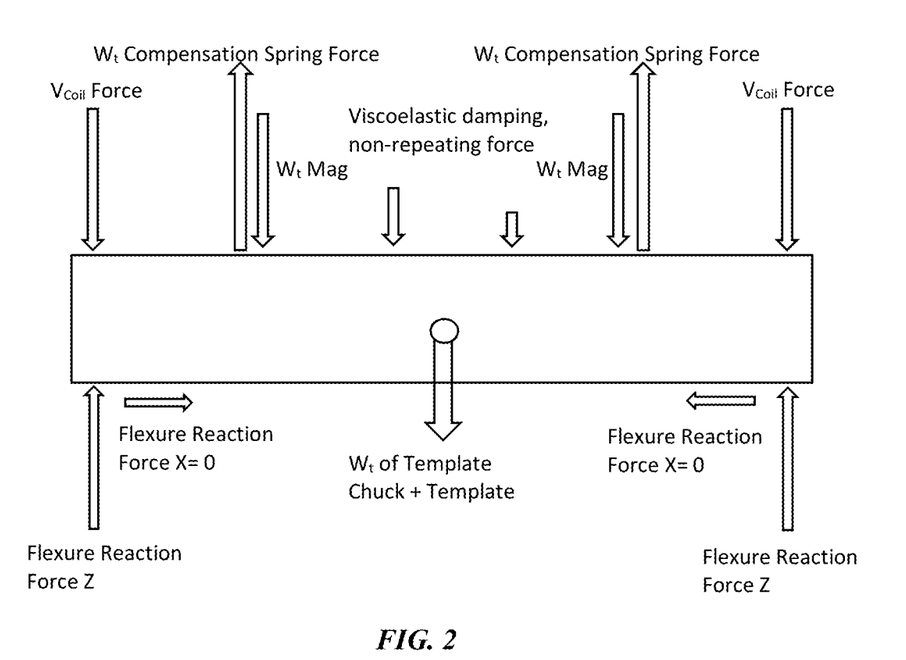
FIG. 2 illustrates the forces exerted on the template chuck and template.

FIF as-imprinted can be characterized after imprinting from overlay distortion data distortion data measurements, for example, Archer™ AIM mark measurements as disclosed in US Patent Publication No. 2019-0033709. The force data calculated from Archer data is referred to as "Archer FIF." However, Archer FIF is a post-imprint measurement. FIF estimation before imprinting involves calibrating out the non-contact imprint force on every wafer, similar to taring a scale. This procedure, referred to as the RFO discussed above or as remove force calibration (RFC), is usually done before imprint on the first field on a wafer and a scheme has been developed for this calibration. The non-contact force at any z-location in the imprint head motion range can be broken down into two parts as shown in FIG. 2, including (a) a highly repeatable and well characterized force $F_{repeatable}(z)$ as a sum of spring and flexure related forces, and (b) disturbances $F_{disturbance}(z)$ including the strain development in the cables, depending upon the initial strain, displacement amplitudes and speeds, any non-linear effects such as friction between cables, motion profile history) that are hard to characterize as:

$$F(z)=F_{repeatable}(z)+F_{disturbance}(z)$$

Figure 3:
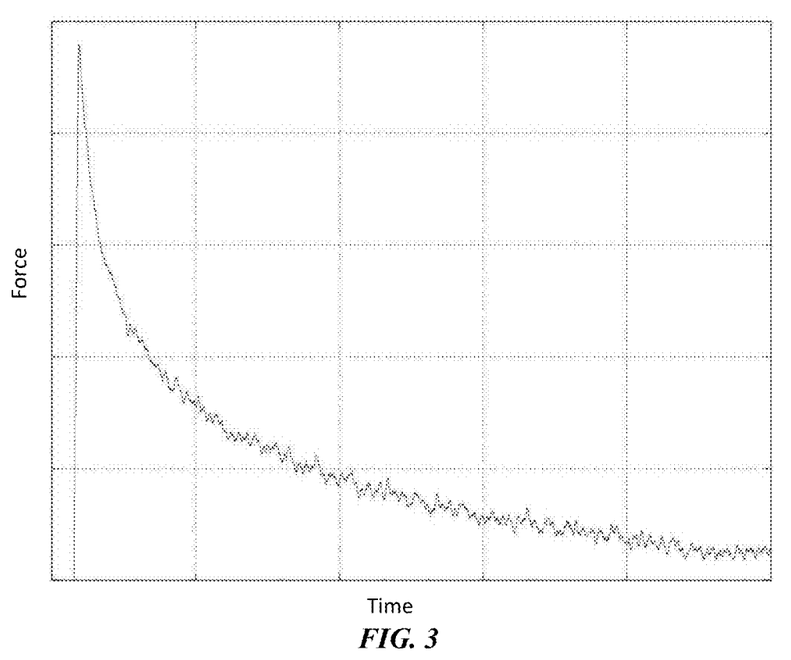
FIG. 3 is a graph showing decaying force magnitude at the imprint plane.
Figure 4:
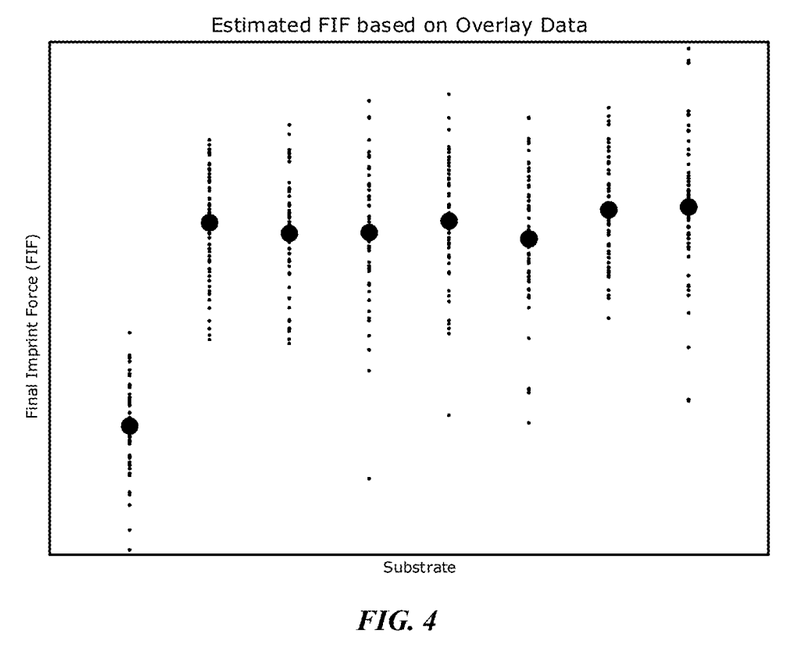
FIG. 4 is a chart showing deviation parameters in small dashes measured across multiple test films on multiple imprint fields over a plurality of test substrates and deviation parameters averaged over each test substrates in large dots.

The RFO or RFC scheme is to remove the non-contact force at the imprint plane at a fixed time instant, for example, 1 second, and zeroes out the force value. However, due to the high time sensitivity of the force decay such as the graph as shown in FIG. 3 and hysteresis dependence, the measurements of this force value may vary from one wafer to another by hundreds of mN. In addition, the scheme cannot correct other disturbances such as a slow dynamic behavior within the wafer as the scheme is only operated once at the beginning of a wafer run. This may result in a persistent jump and drift behavior in final imprint force from wafer to wafer as shown in FIG. 4. The magnitudes may also vary from tool to tool to result in changing decay behavior from wafer to wafer in a single run. While zeroing out the force scale, the force estimation/measurement may be inaccurate to represent the force drift with respect to the previous wafer or field run.

Force Disturbance Model/Scaling Factor Estimation

The difference in RFO measurements is largely based on difference in stress relaxation and tubes during the measurement, and the cable/tubing stress relaxation is dependent on the current position and past motion trajectory of the imprint head. Using the underlying physics of stress relaxation in the cable, a dynamic model of stress relaxation that estimates the force disturbance at time instant u in cables can be established based on prior motion history of the imprint head as:

$$\dot{x}(t)=Ax(t)+Bu(t)$$

$$f_t(t)=Cx(t)+Du(t)$$

or more generally $$f_t(t)=g(x(t),\dot{x}(t),u(t),t)$$

where x(t) is the state variables for the models, ẋ(t) is a time derivative of the state variables x(t) at time t; u(t) is the imprint head positions at a time instant t; and $f_t$ is the force disturbance due to cable stress relaxation of the cables; and g is a non-linear function. The model may be established, that is, the parameters A, B, C, and D, are matrices that may be estimated, using the position and force traces of the imprint head during a previous non-contact calibration routine or between imprint runs. The imprint head positions u(t) may include 1-3 dimensions. The state variables for may include multiple dimensions depending on the order of the model.

The imprint head positions u(t) may be described by 3 or more variables for example as:

$$u(t)=h(z_1(t),z_2(t),z_3(t))$$

where $z_1$, $z_2$, $z_3$ are the encoder positions of the imprint head, which change over time as the imprint head moves from an idle state to an RFO measurement state, and up and down in each imprint cycle. These multiple variables ($z_1$, $z_2$, $z_3$) may be reduced to a single value u using a function h such as an average or as a transformation h to another set u of independent variables that describe the tip, tilt, and position of the imprint head. The imprint head 30 may move to other positions, for example, when masks are loaded or unloaded, or when TTM positions are acquired in non-contact process (pre-overlay).

During imprint process, including the fluid fill phase when FIF is applied, the imprint head is in force control and the force disturbance is not directly observable. Once the model parameters A, B, C, and D have been identified, for example, using least squares regression, and the model is found to be adequate and robust, this model can be used to predict the force disturbance due to cable stress relaxation force control. As the calibration measurement, RFO, is typically done before imprinting a wafer, the average cable stress relaxation disturbance during the RFO and during the actual imprint are different; and hence, it is advantageous to scale the RFO measurement to accordingly estimate and compensate the true average disturbance during imprint. A method using the model predicted disturbance to estimate the scaling factor/gain to scale the RFO measurement is proposed. The method for estimating the scaling factor/ratio may be used for any condition, for example, different resist spread times, on a tool is proposed. To determine a scaling factor SF to be applied to a measured RFO, so as to result in zero error correction of force at the imprint plane, expected imprint head position trace and the above cable stress relaxation that predicts force disturbances are used. The applied actuator force (force setpoint) is adjusted by an amount that corresponds to the RFO times the scaling factor. To calculate the scaling factor SF, a weighting function of the force disturbances at the calibration measurement ($F_{Mod,RFO,i}$) for wafer i (from 1 to n) and force disturbances at time of exposure of field j ($F_{mod,FIF,j}$, j=1 to m) predicted based on expected imprint head motion trajectory can be presented as:

$$W_i = SF \cdot F_{Mod,RFO,i} + \frac{1}{m}\sum_{j=1}^{m} F_{Mod,FIF,i,j}$$

The optimal scaling factor $SF_{opt}$ for the calibration measurement is determined as the scaling factor that minimizes the variance of the scaled wafer average force, $W_i$ as $$\min_{SF} \sum_{i=1}^{n} \left( W_i - \frac{1}{n} \sum_{i=1}^{n} W_i \right)^2$$

The optimal scaling factor can be obtained using any of commonly known optimization or minimization algorithms such as gradient based minimization algorithms, local search methods, genetic algorithms, or a combination thereof. A number of these algorithms are available in commercial software such as MATLAB, MS Excel and as open source libraries in Python, C, C++, and Octave.

The optimal scaling factor is then used to scale the actual calibration measurement $F_{act,RFO,i}$ to obtain the compensation amount/offset for the final imprint force setpoint as:

$$\text{Offset}_i = SF_{opt} \cdot F_{act,RFO,i}$$

Figure 5:
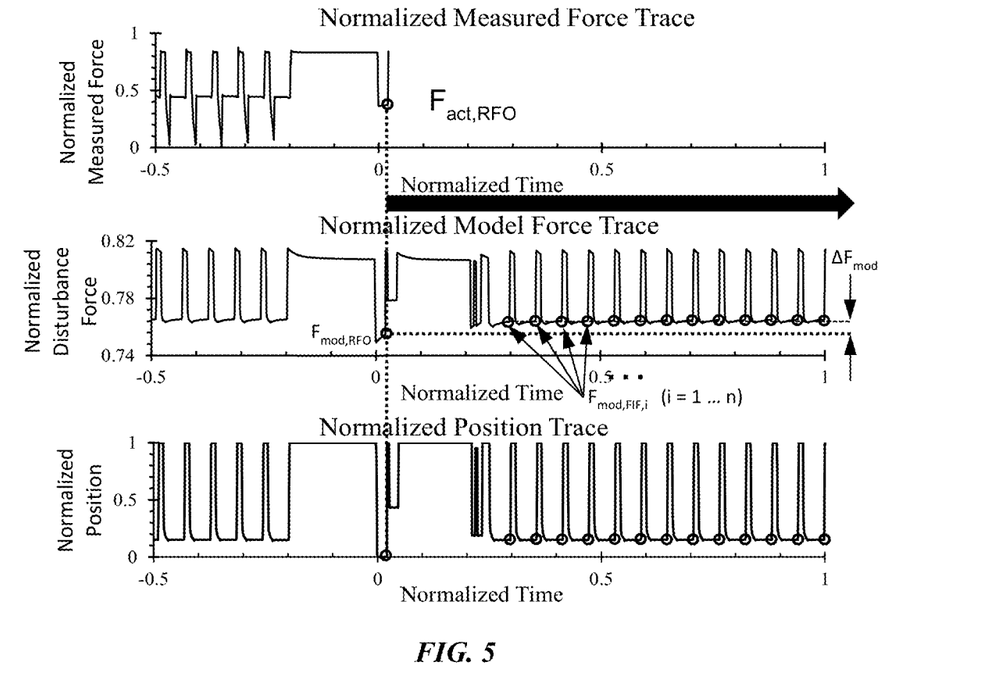
FIG. 5 shows the method of obtaining disturbance force estimation and forecast.
Figure 6:
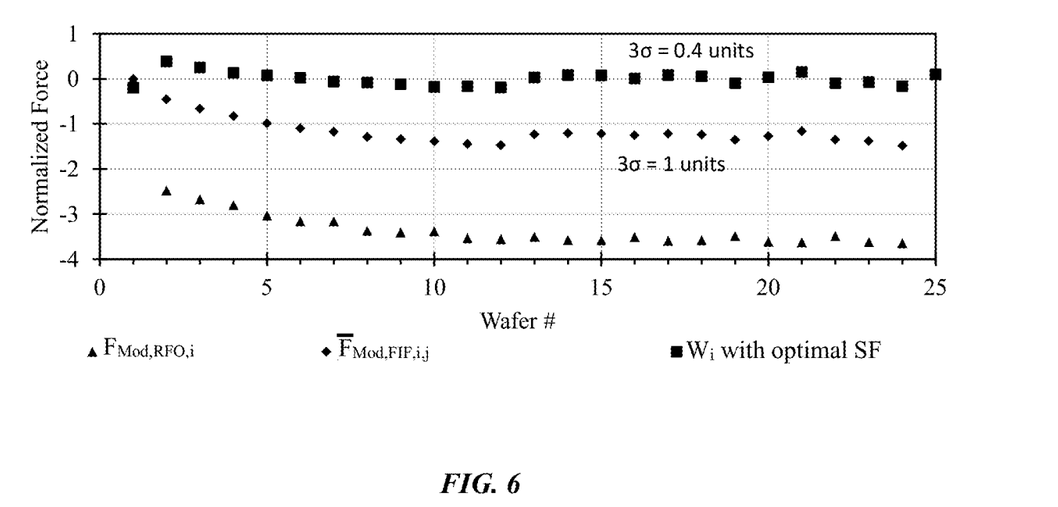
FIG. 6 shows the disturbance force with and without scaling by a scaling factor.

The scaling factor can then be used during the imprint process to scale the RFO measurement appropriately to achieve stable FIF. The force disturbance estimate at different times during an imprint routine is illustrated as FIG. 5. The difference between the model disturbances at RFO $F_{mod,RFO,i}$ and during imprint $F_{mod,FIF,i,j}$ further shows that the measurement at the time of RFO needs to be adjusted, for example, by the scaling factor. This method thus, always scales the RFO value and can be more robust to any modeling errors or modeling instabilities. Another advantage is that the scaling factor estimate can be obtained prior to imprinting & does not require the model to run at all times & apply compensation at all times, thus lower computational cost while running the process (good for throughput). An example of implementation of force disturbance model based on the scaling factor estimation in a multi-wafer imprinting run is shown in FIG. 6, in which the force has been normalized to the target force variation range. The triangle data points in FIG. 6 represent the disturbance estimates from the model at RFO time ($F_{mod,RFO,i}$) before every wafer i. The diamond data points in FIG. 6 are average model estimates of disturbance over all the fields of a wafer at the imprint time. The square data points in FIG. 6 are the compensated force applied at imprint time. An optimal scaling factor was obtained using the model estimates as described in the paragraphs above. By applying the scaling factor, the variation (three times the standard deviations) in imprint force represented by the data points is found to decrease.

Hybrid RFO and Disturbance Model Scheme

As discussed above, a cable stress relaxation model can be presented as:

$$\dot{x}(t) = Ax(t) + Bu(t)$$

$$f_t(t) = Cx(t) + Du(t)$$

or more generally $f_t(t) = g(x(t), \dot{x}(t), u(t), t)$

Once the parameters A, B, C, and D are identified based on the trajectory histories of a predetermined number of non-contact process, an expected position trajectory of the imprint head $x_0$ can be obtained. Using the cable stress relaxation model for the currently used tool, the disturbance force estimation or forecast can be obtained. The disturbance that may be estimated by this model include disturbances related to unique timing or functions related to this wafer, unique idle time before this wafer, mask loading before the wafer, template mapping before the wafer, for example. The imprint head positions u(t) may be described by 3 or more variables for example $$u(t) = h(z_1(t), z_2(t), z_3(t))$$

where $z_1$, $z_2$, $z_3$ are the encoder positions of the imprint head, which change over time as the imprint head moves from an idle state to an RFO measurement state, and up and down in each imprint cycle. These multiple variables ($z_1$, $z_2$, $z_3$) may be reduced to a single value u using a function h such as an average or as a transformation h to another set u of independent variables that describe the tip, tilt, and position of the imprint head. The imprint head may move to other positions, for example, when masks are loaded or unloaded, or when TTM positions are acquired in non-contact process (pre-overlay).

A key feature of this model is the difference between the model disturbance force at the RFO time and at the time of imprint, that is, when FIF is applied. The difference may relate to initial conditions at the time of RFO, the time of RFO, motion sequence between RFO and when imprint starts, spread time, . . . , etc. The model disturbance at each imprint can be pre-calculated from a forecast (planned) motion sequence for the wafer at the time of RFO, or it can be calculated at a time before FIF needs to be applied, while taking actual motion sequences into account. The timing of some process step such as the time for pre-overlay may be difficult to forecast. For example, it may be calculated right before the downward movement along z-axis of the imprint head to the start of the imprint sequence or during or at the end of the cycle one (CL1) spreading sequence.

Figure 7:
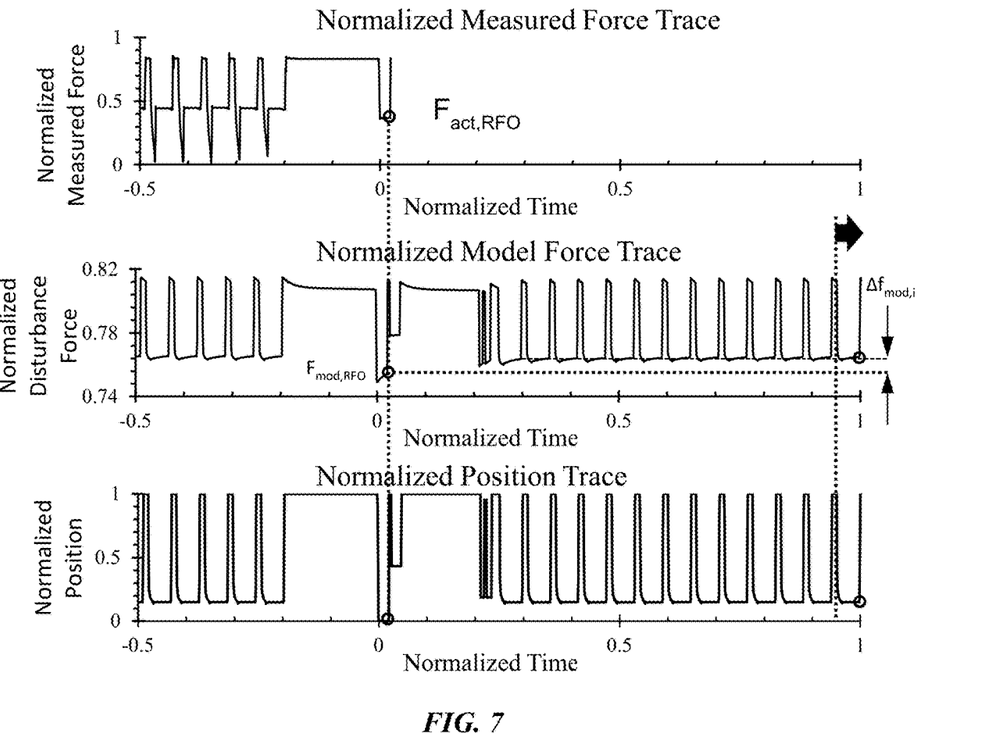
FIG. 7 is a schematic of actual force and force disturbance estimates at different times during an imprint routine.

In FIG. 7, an example of the z-position trajectory, actual force, and model force disturbance of an imprint head for a wafer, is illustrated. At the time of wafer RFO, the actual force disturbance estimated from voice coil current is found as $F_{act,RFO,i}$ and the model disturbance force solution at wafer RFO is found as $F_{mod,RFO,i}$. In one embodiment, the model solution is forecast from the time of RFO to the last imprint performed on a wafer based on the expected imprint head position. The model force disturbance for all imprints at the end of fluid fill just before the exposure is found for all imprints (j) on the wafer i as $F_{mod,FIF,i,j}$. The model difference between each imprint and the RFO time are then found. This represents how much the force disturbance is expected to drift between the RFO and imprint:

$$\Delta F_{mod,i,j} = F_{mod,FIF,i,j} - F_{mod,RFO,i}$$

i=1 to n.

Once the difference between the model disturbance at RFO and the forecast disturbance at the FIF timing is found, the difference is added to the actual RFO measurement to obtain the appropriate offset at the time that the FIF applied. The offset correction at each field of a wafer can be calculated based on either:

the individual disturbance calculation at each field as:

$$\text{FIFoffset}_{i,j} = F_{act,RFO,i} + \Delta F_{mod,i,j} \quad (i=1 \text{ to } n), \text{ or}$$

an average of the disturbance calculation for all fields j of a wafer i $$FIFoffset_i = F_{act,RFO,i} + \frac{1}{m} \sum_{j}^{m} \Delta F_{mod,i,j} \text{ where}$$

j = 1 to m.

In some embodiments, it may be desirable to use a portion of the actual imprint head position profile instead of a forecast position profile when computing the model force disturbance for the next wafer run. This can make the model force disturbance $F_{mod,FIF,i,j}$ more accurate, for example, when the imprint process includes functions for which extra timing is difficult to forecast such as for pre-overlay. With the actual imprint head position profile replacing a portion of the forecast position profile as shown in FIG. 7. The model forecast starts just before the imprint head moves down to be in contact with the imprint material for the next imprint. The forecast can begin at any time before FIF needs to be applied, for example, just after the template 18 contacts the formable material 34 causing it to start spreading. Therefore, real time disturbance compensation can be avoided.

When a portion of the actual imprint head position profile is used instead of the forecast position profile for each imprint, the FIF offset can be calculated at the earliest at the end of the actual position profile portion (the beginning of the forecasting period), and the offset is calculated similarly as before:

$$\Delta F_{mod,i,j} = F_{mod,FIF,i,j} - F_{mod,RFO,i}$$

($i=1\ldots n$) and ($j=1\ldots m$)

$$\text{FIFOffset}_i = F_{act,RFO,i} + \Delta F_{mod,i,j}$$

($i=1\ldots n$) and ($j=1\ldots m$)

The original model is broken down into first order systems, and $k_1$ and $k_2$ are the DC gains of the first order systems.

Figure 8:
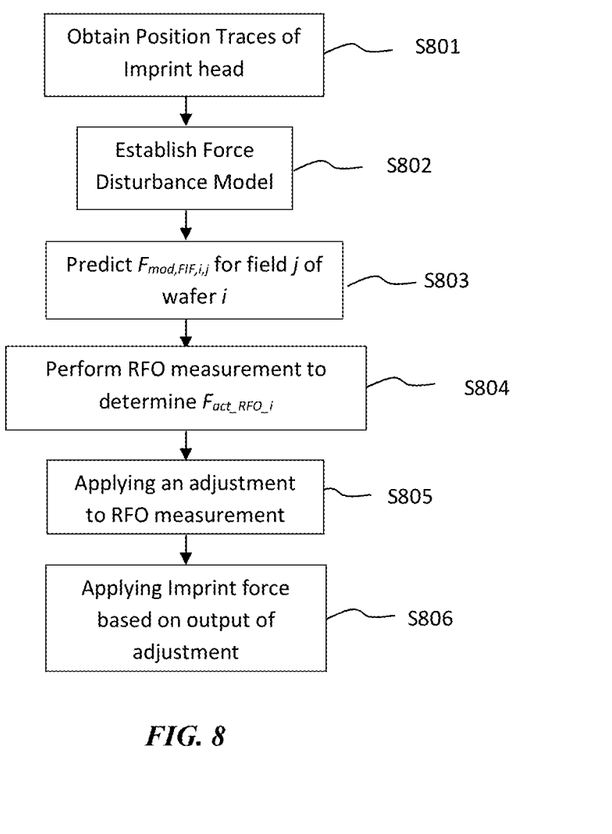
FIG. 8 shows the process of a method for correcting a final imprint force.

FIG. 8 shows the process flow of a method to estimate force disturbances and corrects the FIF based on the estimated force disturbances. The correction is calculated at the RFO from forecast trajectory for the wafer, and an average of the disturbances at all fields is estimated and applied to every field. Therefore, the same force offset correction is applied at every field. Alternatively, the disturbance at each field is estimated individually and applied to the corresponding field. The correction may also be calculated from the actual z-position trace at the time before FIF needs to be applied. In step S801, a cable stress relaxation model is established as:

$$\dot{x}(t) = Ax(t) + Bu(t)$$

$$f_t(t) = Cx(t) + Du(t)$$

The parameters A, B, C, and D are estimated using the position and force traces of the imprint head during a previous non-calibration routine or between two consecutive imprint processes. To establish the force disturbance model, positions of traces of an imprint head (IH) exercising along a predetermined trajectory are obtain in step S801. In step S802, the force disturbance model is established based on prior position and the obtained force traces. In step S803, the disturbance force $F_{mod,FIF,i}$ for the wafer i is predicted using a predetermined motion sequence based on the force disturbance model, assuming there are n wafers (i=1 to n) in a wafer run. In step S804, RFO measurement is performed to determine an actual force $F_{act,RFO,i}$ measured prior to imprinting the specific wafer i. An adjustment is applied to the RFO measurement in step S805. An imprint force based on the output of the adjustment is then applied to the imprint process in step S806.

In the method illustrated in FIG. 8, the adjustment to the RFO measurement may include applying the adjustment to the RFO measuring by scaling the actual force $F_{act,RFO}$ with a scaling factor SF calculated based on the disturbance force $F_{mod,FIF,i}$ of the wafer i and an average of $F_{mod,FIF,i,j}$ of the field j of the wafer i. The scaling factor SF may be calculated by minimizing a weighting function $W_i$ as:

$$W_i = SF \cdot F_{Mod,RFO,i} + \frac{1}{m}\sum_{j=1}^{m} F_{Mod,FIF,i,j}$$

$$\min_{SF}\sum_{i=1}^{n}\left(W_i - \frac{1}{n}\sum_{i=1}^{n}W_i\right)^2$$

where the scaling factor is calculated for each wafer i and field j of the wafer i.

In another embodiment, the adjustment is applied by calculating a difference $\Delta F_{mod,i,j}$ between $F_{mod,RFO,i}$ and $F_{mod,FIF,i,j}$ and adding the difference $\Delta F_{mod,i,j}$ to the $F_{act,RFO,i}$. The difference of force disturbance $\Delta F_{mod,i}$ is added to the $F_{act,RFO}$ for each individual field j of the wafer i. An average of the difference of force disturbance $\Delta F_{mod,i}$ for n wafers may be added to $F_{act,RFO}$ as:

$$\text{FIF Offset}_i = F_{act,RFO,i} + \frac{1}{m}\sum_{j}\Delta F_{mod,i,j}.$$

The method illustrated in FIG. 8 may be applied to an imprint process to manufacture an article. The method to manufacture an article includes applying a formable material such as an imprint resist layer on a substrate. A template with a pattern is brought into contact with the formable material to transfer the pattern to the formable material. The method as shown in FIG. 8 is then applied to adjust the final imprint force applied to the imprint process for manufacturing the article.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method for correcting a final imprint force FIF in an imprint process, comprising:
    obtaining position traces of an imprint head exercising along a predetermined trajectory;
    establishing a force disturbance model based on prior position and force traces of the imprint head;
    predicting a disturbance force $F_{mod,FIF,i,j}$ that will be applied to a field j of a wafer i using a predetermined motion sequence based on the force disturbance model, where i=1 to n, where j=1 to m;
    performing a residual force offset (RFO) measurement to determine an actual force disturbance $F_{act,RFO,i}$ measured prior to imprinting the wafer i;
    applying an adjustment to the $F_{act,RFO,i}$; and
    applying an imprint force to a film on the wafer i with the imprint head based on an output of the adjustment applied to the $F_{act,RFO,i}$ and a desired force to be applied to the film on the wafer i.

2. The method according to claim 1, wherein the applying the adjustment to the $F_{act,RFO,i}$ further comprises scaling the $F_{act,RFO,i}$ with a scaling factor SF calculated based on a modeled disturbance force $F_{mod,RFO,i}$ of the wafer i and an average of $F_{mod,FIF}$,i,j over m fields of the wafer i.

3. The method according to claim 2, wherein the scaling factor SF is calculated by minimizing a weighting function $W_i$ as:

$$W_i = SF \cdot F_{Mod,RFO,i} + \frac{1}{m}\sum_{j=1}^{m} F_{Mod,FIF,i,j}$$

$$\min_{SF} \sum_{i=1}^{n}\left(W_i - \frac{1}{n}\sum_{i=1}^{n} W_i\right)^2$$

where the scaling factor is calculated for each of the wafer i and field j of the wafer i.

4. The method of claim 1, wherein the applying the adjustment further comprises:
 calculating a difference $\Delta F_{mod,i,j}$ between $F_{mod,RFO,i}$ and $F_{mod,FIF,i,j}$; and
 adding the difference $\Delta F_{mod,i,j}$ to the $F_{act,RFO,i}$.

5. The method according to claim 4, wherein the difference of force disturbance $\Delta F_{mod,i,j}$ is added to the $F_{act,RFO,i}$ for each individual field j of the wafer i.

6. The method according to claim 5, wherein an average of the difference of force disturbance $\Delta F_{mod,i,j}$ for m fields is added to $F_{act,RFO}$ as:

$$FIF\ \text{Offset}_i = F_{act,RFO,i} + \frac{1}{m}\sum_{j} \Delta F_{mod,i,j}.$$

\* \* \* \* \*